(12) United States Patent
Lee

(10) Patent No.: US 11,450,797 B2
(45) Date of Patent: Sep. 20, 2022

(54) DIFFERENTIAL THERMOELECTRIC DEVICE

(71) Applicant: 3M INNOVATIVE PROPERTIES COMPANY, St. Paul, MN (US)

(72) Inventor: Jae Yong Lee, Santa Clara, CA (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 208 days.

(21) Appl. No.: 16/766,394

(22) PCT Filed: Dec. 3, 2018

(86) PCT No.: PCT/IB2018/059582
§ 371 (c)(1),
(2) Date: May 22, 2020

(87) PCT Pub. No.: WO2019/111133
PCT Pub. Date: Jun. 13, 2019

(65) Prior Publication Data
US 2021/0396598 A1    Dec. 23, 2021

Related U.S. Application Data

(60) Provisional application No. 62/596,198, filed on Dec. 8, 2017.

(51) Int. Cl.
*H01L 35/04* (2006.01)
*G01K 7/02* (2021.01)
(Continued)

(52) U.S. Cl.
CPC ............... *H01L 35/04* (2013.01); *G01K 7/02* (2013.01); *G01K 7/021* (2013.01); *H01L 35/00* (2013.01);
(Continued)

(58) Field of Classification Search
CPC ......... H01L 35/04; H01L 35/28; H01L 35/32; H01L 35/10; G01K 7/02; G01K 7/021
See application file for complete search history.

(56) References Cited

U.S. PATENT DOCUMENTS 4,040,042 A    8/1977   Mayer
4,050,291 A    9/1977   Nelson
(Continued)

FOREIGN PATENT DOCUMENTS

WO    WO-2016063465 A1 *  4/2016  ............. G01K 17/00
WO    WO 2017-222853       12/2017
(Continued)

OTHER PUBLICATIONS

International Search Report for PCT International Application No. PCT/IB2018/059582, dated Mar. 15, 2019, 3 pages.

*Primary Examiner* — Lindsey A Bernier
(74) *Attorney, Agent, or Firm* — Sriram Srinivasan; Yufeng Dong

(57) ABSTRACT

Differential thermoelectric devices are provided for monitoring a change of areal thermal energy dissipation rate and surface temperature profile. The devices include a through electrode connecting to different sets of thermoelectric elements at different regions of the device. A sensing circuitry is electrically connected to the thermoelectric elements to measure a voltage output.

18 Claims, 7 Drawing Sheets

(51) Int. Cl.
*H01L 35/00* (2006.01)
*H01L 35/10* (2006.01)
*H01L 35/32* (2006.01)
*G01K 13/024* (2021.01)
*H01L 35/28* (2006.01)

(52) U.S. Cl.
CPC .............. *H01L 35/10* (2013.01); *H01L 35/32* (2013.01); *G01K 13/024* (2021.01); *H01L 35/28* (2013.01)

(56) References Cited

U.S. PATENT DOCUMENTS

| | | |
|---|---|---|
| 4,240,072 A | 12/1980 | Fowler |
| 5,668,535 A | 9/1997 | Hendrix |
| 6,110,260 A | 8/2000 | Kubokawa |
| 6,894,620 B2 | 5/2005 | Reinhardt |
| 7,261,762 B2 | 8/2007 | Kang |
| 7,713,339 B2 | 5/2010 | Johansson |
| 8,029,608 B1 | 10/2011 | Breslin |
| 8,388,717 B2 | 3/2013 | Livingstone |
| 9,120,043 B2 | 9/2015 | Johansson |
| 9,186,609 B2 | 11/2015 | Sherman, III |
| 9,207,727 B2 | 12/2015 | Balogh |
| 9,366,448 B2 | 6/2016 | Dean-Hendricks |
| 2006/0266402 A1 | 11/2006 | Zhang |
| 2010/0127299 A1 | 5/2010 | Smith |
| 2011/0185895 A1 | 8/2011 | Freen |
| 2012/0143540 A1 | 6/2012 | Chen |
| 2013/0325368 A1 | 12/2013 | Robb |
| 2014/0083292 A1 | 3/2014 | Weiden |
| 2014/0338716 A1 | 11/2014 | Nakajima |
| 2016/0005947 A1* | 1/2016 | Suda ........................ H01L 35/22 136/212 |
| 2016/0349117 A1 | 12/2016 | Castro et al. |
| 2017/0211990 A1* | 7/2017 | Gouko ..................... G01K 3/14 |
| 2018/0313725 A1 | 11/2018 | Harada et al. |

FOREIGN PATENT DOCUMENTS

| | | |
|---|---|---|
| WO | WO 2017-222862 | 12/2017 |
| WO | WO 2017-223278 | 12/2017 |
| WO | WO 2018-178821 | 10/2018 |
| WO | WO 2018-198001 | 11/2018 |

* cited by examiner

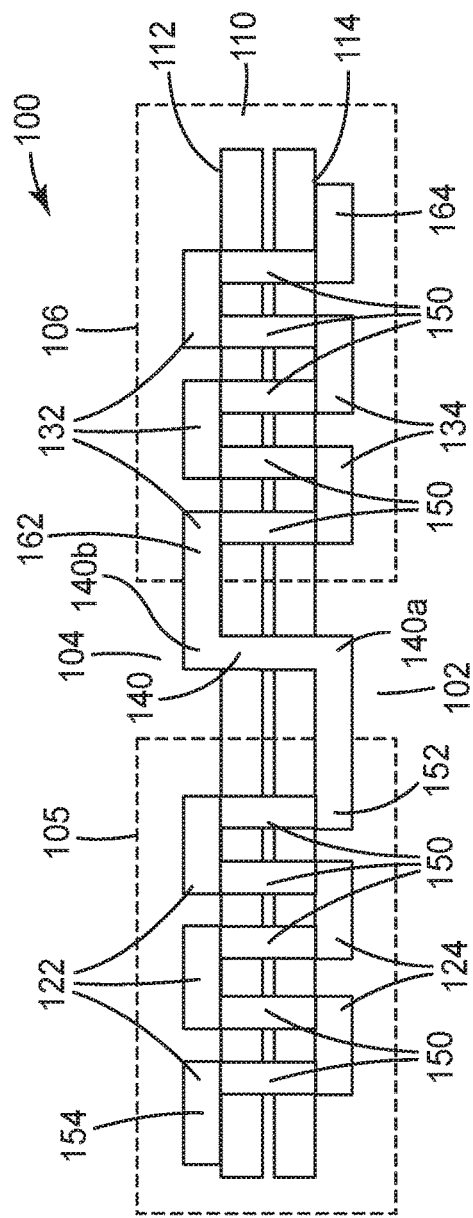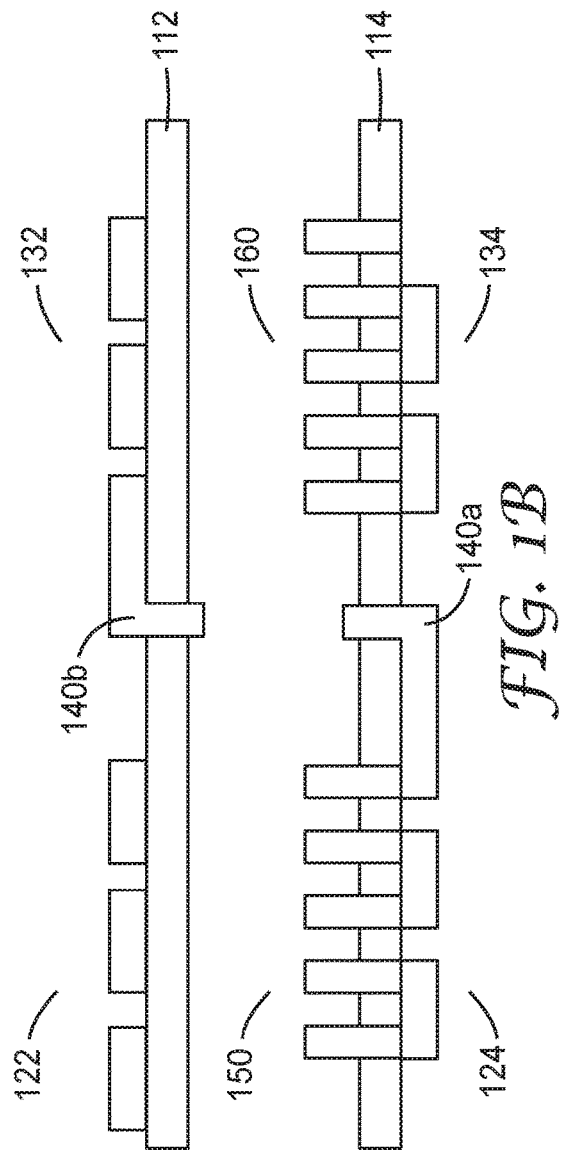
FIG. 1A
FIG. 1B

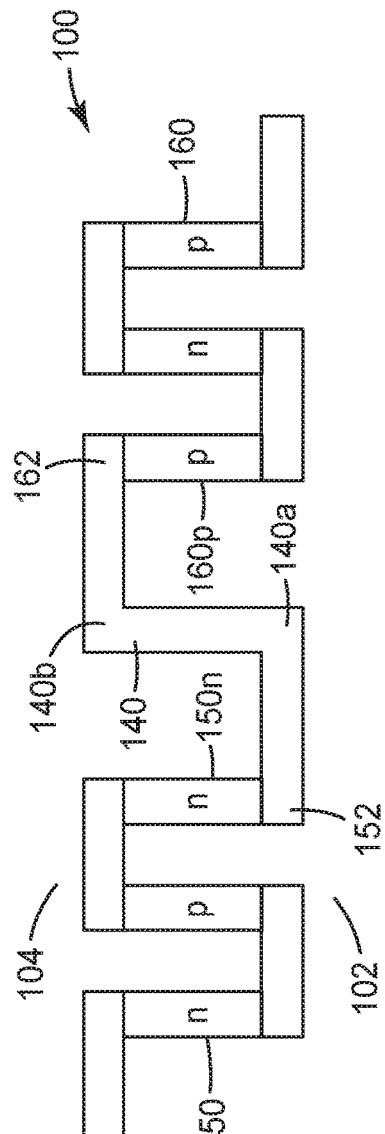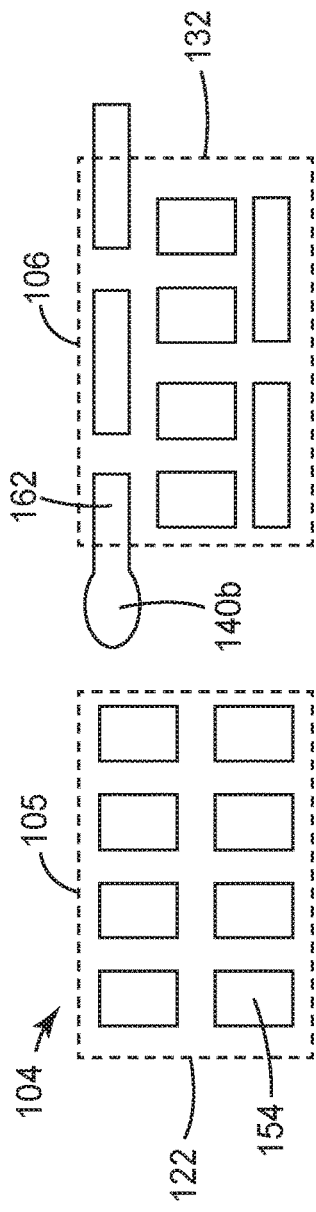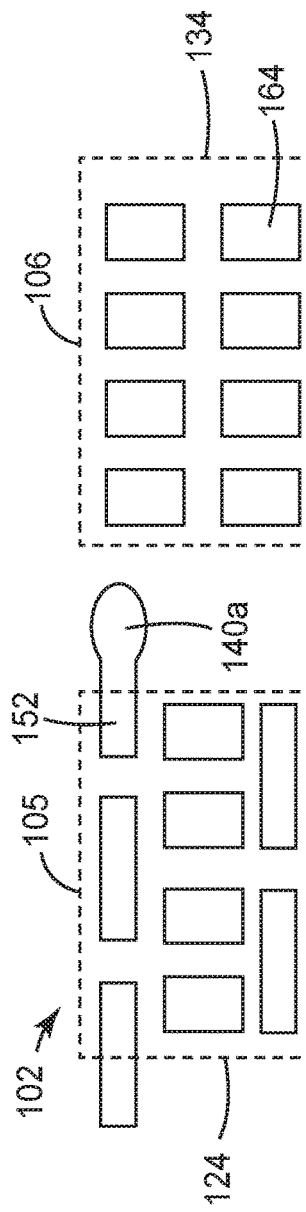

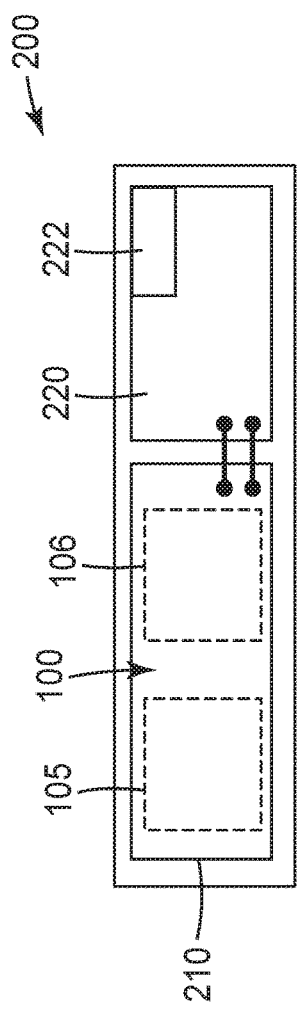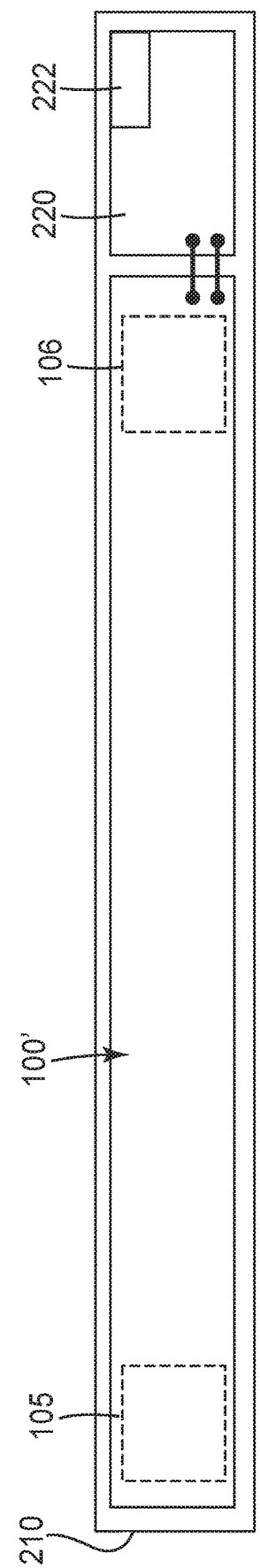

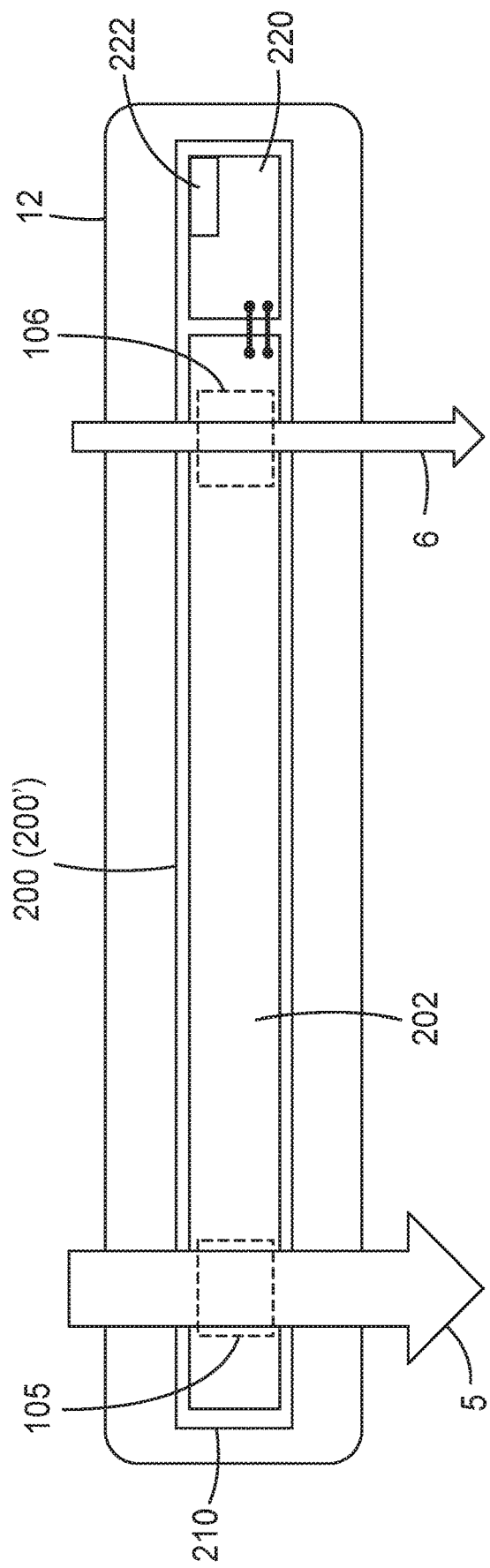

DIFFERENTIAL THERMOELECTRIC DEVICE

CROSS REFERENCE TO RELATED APPLICATIONS

This application is a national stage filing under 35 U.S.C. 371 of PCT/IB2018/059582, filed Dec. 3, 2018, which claims the benefit of U.S. Application No. 62/596,198, filed Dec. 8, 2017, the disclosure of which is incorporated by reference in its/their entirety herein.

TECHNICAL FIELD

The present disclosure relates to differential thermoelectric devices with a single voltage output, and methods of making and using the same.

BACKGROUND

Thermoelectric devices have been widely used for direct conversion of temperature differences to electric voltage/current and vice versa. A thermoelectric device can work by creating an electrical voltage/current when there is a different temperature on each side of the device.

SUMMARY

The present disclosure provides a differential thermoelectric device for monitoring a change of areal thermal energy dissipation rate and surface temperature profile where the device covers. This can be achieved by measuring a single electric voltage output from the thermoelectric device.

In one aspect, the present disclosure describes a thermoelectric sensor including a substrate having opposite first and second major surfaces, and a plurality of thermoelectric elements each supported by the substrate and extending between opposite first and second major surfaces of the substrate. The plurality of thermoelectric elements includes first and second sets of thermoelectric elements. The first and second sets each include one or more thermoelectric elements electrically connected in series between a proximal end and a distal end thereof. The first set is disposed at a first region of the substrate, and the second set is disposed at a second region of the substrate. The sensor further includes a through electrode extending through the substrate and having a first end connecting to the proximal end of the first set of thermoelectric elements on the first major surface of the substrate and a second end connecting to the proximal end of the second set of thermoelectric elements on the second major surface of the substrate. A sensing circuitry is electrically connected to the distal ends of the first and second sets of thermoelectric elements to measure a voltage output.

In another aspect, the present disclosure describes an air filtration apparatus including an air filter having an inlet surface and an outlet surface. The air filter is configured to filter air flowing therethrough from the inlet surface to the outlet surface. A thermoelectric sensor described herein is attached to the air filter, having the first and second regions at the first or second major surface exposed to the air flow. The measured voltage output representing a status of the air flow through the air filter In another aspect, the present disclosure describes a method of monitoring a thermal energy dissipation rate on a surface of a thermoelectric sensor. The method includes providing a substrate having opposite first and second major surfaces, and providing a plurality of thermoelectric elements each supported by the substrate and extending between opposite first and second major surfaces of the substrate. The plurality of thermoelectric elements includes first and second sets of thermoelectric elements. The first and second sets each include one or more thermoelectric elements electrically connected in series between a proximal end and a distal end. The first set is disposed at a first region of the substrate, and the second set is disposed at a second region of the substrate. A through electrode is provided, extending through the substrate and having a first end connecting to the proximal end of the first set of thermoelectric elements on the first major surface and a second end connecting to the proximal end of the second set of thermoelectric elements on the second major surface. The method further includes measuring, via a sensing circuitry, a voltage output between the distal ends of the first and second sets of thermoelectric elements.

Various unexpected results and advantages are obtained in exemplary embodiments of the disclosure. One such advantage of exemplary embodiments of the present disclosure is that monitoring the areal change of thermal energy dissipation rate and surface temperature profile can be achieved by measuring a single electric voltage output from the device. This eliminates the need of multiple thermoelectric devices to be connected to an electric circuitry for signal processing.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which:

FIG. 1A illustrates a schematic cross-sectional view of a differential thermoelectric device with single voltage output, according to one embodiment.

FIG. 1B illustrates a process of laminating two flexible circuits to form the thermoelectric device of FIG. 1A, according to one embodiment.

FIG. 2A illustrates a simplified schematic view of the differential thermoelectric device of FIG. 1A.

FIG. 2B illustrates a top view of the differential thermoelectric device of FIG. 1A.

FIG. 2C illustrates a bottom view of the differential thermoelectric device of FIG. 1A.

FIG. 4A is a top view of a thermoelectric sensor, according to one embodiment.

FIG. 4B is a top view of an elongated thermoelectric sensor, according to another embodiment.

FIG. 5 is a top view of the thermoelectric sensor of FIG. 4A or 4B used for detecting air flow.

Figure 3A:
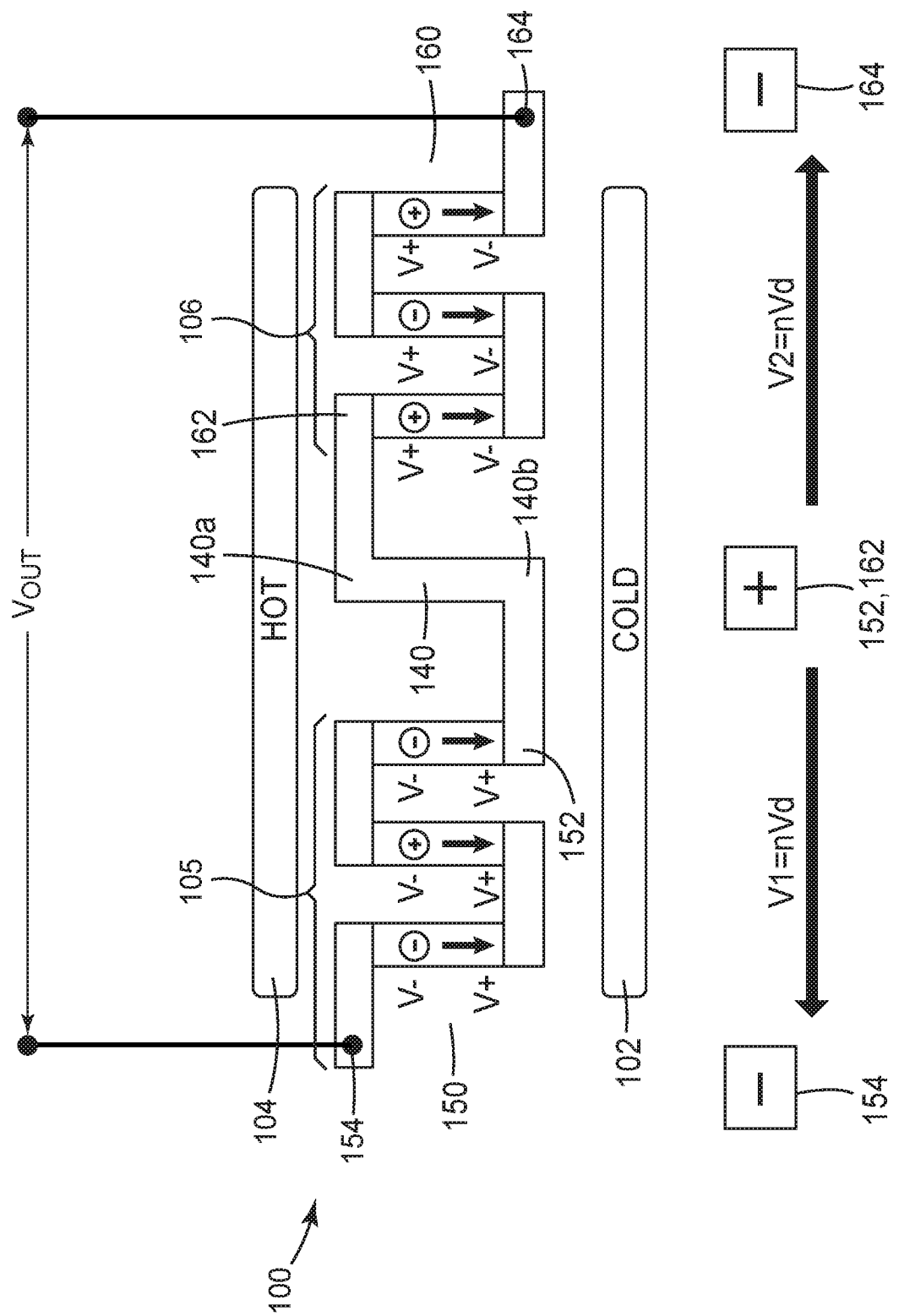
FIG. 3A illustrates a schematic cross-sectional view of a differential thermoelectric device having a uniform thermal distribution on one surface.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

The present disclosure provides a differential thermoelectric device for monitoring areal change of thermal energy dissipation rate and surface temperature profile where the device covers. This can be achieved by measuring a single electric voltage output from the device. In some embodiments, the differential thermoelectric device can be applied to an object surface to track the surface temperature profile. The single voltage output of the differential thermoelectric device can represent a temperature profile change by both voltage level and polarity. In some embodiments, the differential thermoelectric device can be applied to an air filtration apparatus to measure the air flow difference upstream and downstream of an air filter, and to determine the status of the air filter.

FIG. 1A illustrates a differential thermoelectric device 100, according to one embodiment. The differential thermoelectric device 100 includes multiple thermoelectric elements supported by a substrate 110. A first set 150 of the thermoelectric elements are disposed at a first region 105 of the substrate 110; and a second set 160 of the thermoelectric elements are disposed at a second region 106 of the substrate 110. The substrate 110 has opposing major surfaces 102 and 104. The thermoelectric elements each extend between the surfaces 102 and 104 and have their respective ends electrically connected by electrodes 122, 132, 124 and 134. The first set 150 of the thermoelectric elements are electrically connected in series via electrodes 122 on the surface 104 and electrodes 124 on the surface 102; and the second set 160 of thermoelectric elements are electrically connected in series via electrodes 132 on the surface 104 and electrodes 134 on the surface 102.

In the embodiment of FIG. 1A, the first set 150 of the thermoelectric elements includes one or more p-type thermoelectric elements and one or more n-type thermoelectric elements alternatingly connected in series between a proximal end 152 and a distal end 154; and the second set 160 of thermoelectric elements includes one or more p-type thermoelectric elements and one or more n-type thermoelectric elements alternatingly connected in series between a proximal end 162 and a distal end 164.

In some embodiments, the thermoelectric elements may be formed by disposing (e.g., printing, dispensing, etc.) thermoelectric materials onto the substrate 110. In some embodiments, the thermoelectric elements may be provided in the form of thermoelectric solid chips. The p-type thermoelectric elements may be made of a p-type semiconductor material such as, for example, $Sb_2Te_3$ or its alloys. The n-type thermoelectric elements may be made of an n-type semiconductor material such as, for example, $Bi_2Te_3$ or its alloys. Exemplary thermoelectric sensor modules and methods of making and using the same are described in U.S. Patent Application No. 62/353,752 (Lee et al.), which is incorporated herein by reference.

The differential thermoelectric device 100 further includes a through electrode 140. The through electrode 140 extends through the substrate 110 between opposite first and second ends 140a and 140b thereof. The first end 140a electrically connects to the proximal end 152 of the first set 150 of thermoelectric elements on the first major surface 102 of the substrate 110; and the second end 140b electrically connects to the proximal end 162 of the second set 160 of thermoelectric elements on the second major surface 104 of the substrate 110.

In the illustrated embodiment of FIG. 1B, the substrate 110 is formed by laminating a first flexible substrate 112 and a second flexible substrate 114. The electrodes 122 and 132 are formed on the first flexible substrate 112. The thermoelectric elements 150 and 160, and the connected electrodes 124 and 134 are supported by the second flexible substrate 114. The first and second flexible substrates 112 and 114 can be aligned and laminated where vertical or via conductors (e.g., solder) can be used to electrically connect the thermoelectric elements 150 and 160 to the respective electrodes 122, 132, 124 and 134. As shown in FIG. 1B, the through electrode 140 can be formed by connecting the first end 140a and the second end 140b by an electrical conductor (e.g., via soldering) when laminating the first and second flexible substrates 112 and 114. It is to be understood that the substrate 110 may have any suitable configurations to support the thermoelectric elements and the electrodes. The substrate 110 may be a flexible substrate made of any suitable materials such as, for example, polyethylene, polypropylene, cellulose, etc. The electrodes 122, 132, 124 and 134 can include any suitable electrically conductive materials such as, metals, metal alloys, etc.

FIG. 2A illustrates a simplified schematic view of the differential thermoelectric device 100 of FIG. 1A (the substrate 110 not shown). FIG. 2B illustrates a top view of the differential thermoelectric device 100. FIG. 2C illustrates a bottom view of the differential thermoelectric device 100. The first set 150 includes a n-type thermoelectric element 150n at the proximal end 152; and the second set 160 includes a p-type thermoelectric element 160p at the proximal end 162. The through electrode 140 extends between the opposite surfaces 102 and 104 of the differential thermoelectric device 100, and has opposite ends 140a and 140b respectively connected to the proximal ends 152 and 162 of the first and second sets 150 and 160 of thermoelectric elements.

As shown in FIG. 2B, on the surface 104 of the differential thermoelectric device 100, the set of electrodes 122 are disposed in the first region 105 to electrically connect the ends of the first set 150 of the thermoelectric elements at the side 104; and the set of electrodes 132 are disposed in the second region 106 to electrically connect the ends of the first set 150 of thermoelectric elements at the side 104. As shown in FIG. 2C, on the surface 102 of the differential thermoelectric device 100, the set of electrodes 124 are disposed in the first region 105 to electrically connect the ends of the first set 150 of thermoelectric elements at the side 102; and the set of electrodes 134 are disposed in the second region 106 to electrically connect the ends of the first set 150 of thermoelectric elements at the side 102.

Figure 3B:
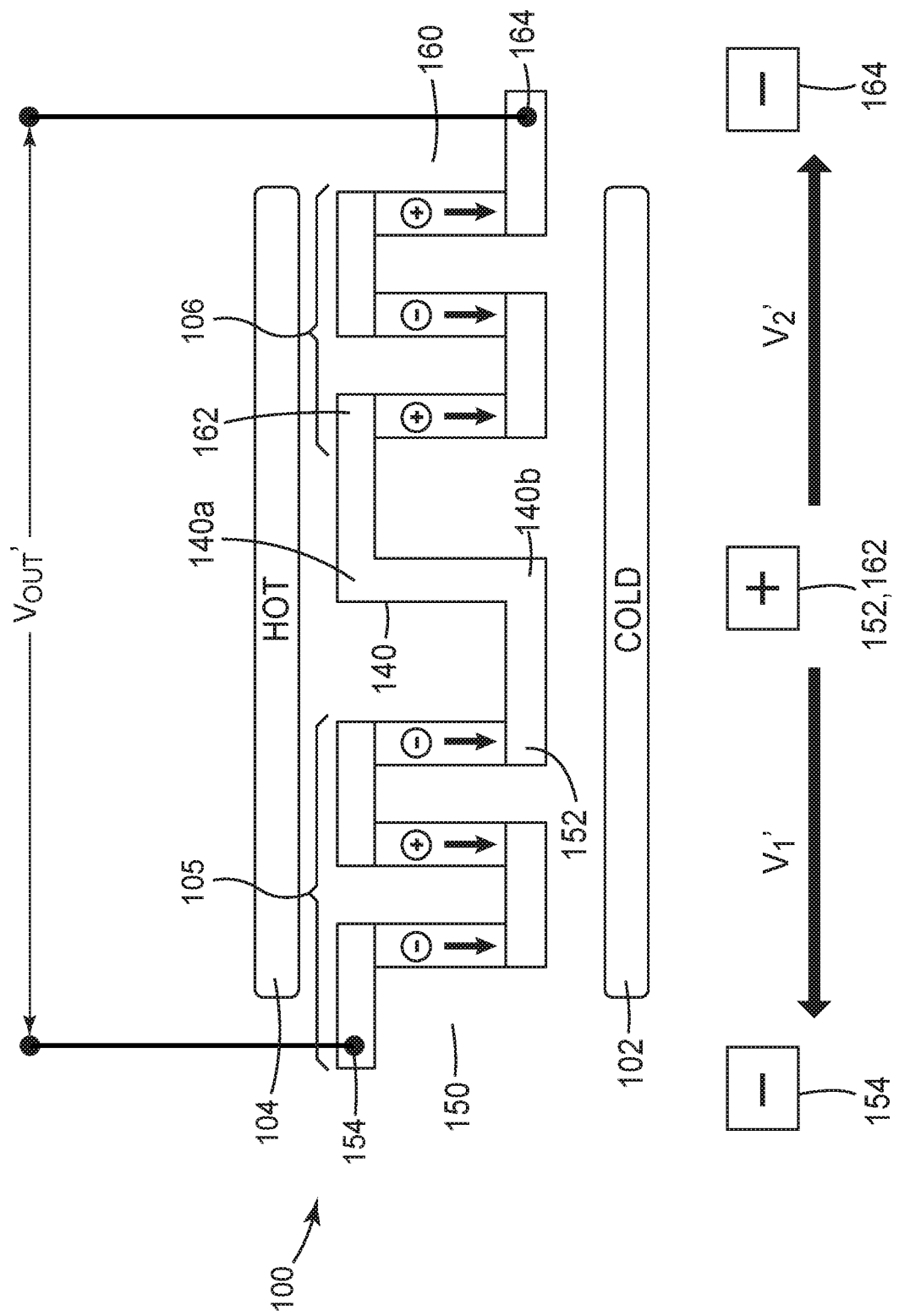
FIG. 3B illustrates a schematic cross-sectional view of a differential thermoelectric device having a non-uniform thermal distribution on one surface.

FIGS. 3A-B illustrate the working principles of the differential thermoelectric device 100, according to some embodiments. As shown in FIG. 3A, the first major surface 102 of the device 100 is a cold surface, and the second major surface 104 is a hot surface. The temperature gradient between the opposite surfaces 102 and 104 can generate a voltage output $V_d = V_+ - V_-$ between opposite ends of each thermoelectric elements in the first and second sets 150 and 160. This relates to the so called Seebeck effect, i.e., a conversion of heat directly into electricity at the junction of materials having different Seebeck coefficients. The generated voltage $V_d$ can be a function of the temperature gradient between the opposite surfaces 102 and 104. In general, the voltage $V_d$ for a thermoelectric element increases with an increasing temperature gradient between the opposite ends of the thermoelectric element.

When the temperature gradients between the opposite surfaces 102 and 104 at the first and second regions 105 and 106 of the device 100 are substantially the same, the first set 150 of the thermoelectric elements can generate a first voltage $V_1=nV_d$, and the second set 160 of thermoelectric elements can generate a second voltage $V_2=nV_d$, where n is the number of thermoelectric elements in the first set 150 or the second set 160, and $V_d$ is the voltage generated at opposite ends of each thermoelectric elements due to the temperature gradient. The proximal ends 152 and 162 of the first and second sets 150 and 160 are electrically connected by the through electrode 140, and thus can have the substantially the same electrical potential. A voltage output $V_{out}$ can be measured at the distal ends 154 and 164 of the respective first and second sets of thermoelectric elements 150 and 160. The voltage output $V_{out}$ equals to $(V_2-V_1)$, where $V_1$ is the first voltage generated by the first set 150 of the thermoelectric elements, and $V_2$ is the second voltage generated by the second set 160 of the thermoelectric elements.

In some embodiments, one of the cold surface 102 and the hot surface 104 can work as a reference surface (e.g., maintained at a predetermined temperature), and the other one can work as a sensing surface (e.g., exposed to ambient air for heat exchange therebetween). For example, the cold surface 102 of the differential thermoelectric device 100 can be encapsulated to prevent heat exchange with environment, and the hot surface 104 can be exposed to air for heat dissipation.

It is to be understood that the first and second regions can be independent regarding choosing a reference surface or a sensing surface. For example, in some embodiments, one of the cold surface 102 and the hot surface 104 at the first region 105 can work as a reference surface (e.g., maintained at a predetermined temperature), and the other one can work as a sensing surface (e.g., exposed to ambient air for heat exchange therebetween), independent to the choice for the second region 106. Similarly, one of the cold surface 102 and the hot surface 104 at the second region 106 can work as a reference surface (e.g., maintained at a predetermined temperature), and the other one can work as a sensing surface (e.g., exposed to ambient air for heat exchange therebetween), independent to the choice for the first region 105.

In some embodiments, when the hot surface 104 (or a portion of the hot surface 104) works as a reference surface, a heating element can be attached to the reference surface to maintain the temperature thereof at a relatively high level. Exemplary heating elements are described in U.S. Patent Application No. 62/584,261, which is incorporated herein by reference. In some embodiments, when the cool surface 102 (or a portion of the cool surface 102) works as a reference surface, a cooling element can be attached to the reference surface to maintain the temperature thereof at a relatively low level. In some embodiments, a thermal insulation layer can be applied to the reference surface to prevent it from heat exchange with surrounding environment.

FIG. 3A illustrates an exemplary situation where the hot surface 104, as a sensing surface, has a substantially uniform temperature profile, e.g., the temperature at the first region 105 and the second region 106 being substantially the same. When the first and second sets 150 and 160 are substantially the same (e.g., having the same number of substantially identical thermoelectric elements), the $V_{out}$ is offset to about zero due to the same amount of potential change ($V_1=V_2$) with the opposite voltage polarity.

FIG. 3B illustrates another exemplary situation where the hot surface 104, as a sensing surface, has a non-uniform temperature profile, e.g., the temperature at the first region 105 and the second region 106 being different. Even when the first and second sets 150 and 160 have the same number of substantially identical thermoelectric elements, the $V_{out}'$ (i.e., $V_2'-V_1'$) has a non-zero value due to the temperature difference between the first and second regions 105 and 106 on the hot surface 104. As illustrated in FIGS. 3A-B, the measured voltage output ($V_{out}$ or $V_{out}'$) can reflect the relative temperature difference between the first region 105 and the second region 106. That is, the surface temperature profile on the sensing surface can be determined by measuring the single voltage output between the distal ends 154 and 164.

It is to be understood that the differential thermoelectric device 100 may not have a structural symmetry. For example, the first and second sets 150 and 160 may have different numbers of thermoelectric elements, and the thermoelectric elements in the two sets may not be the same. The voltage output $V_{out}$ still equals to $(V_2-V_1)$, where $V_1$ is the first voltage generated by the first set 150 of the thermoelectric elements, and $V_2$ is the second voltage generated by the second set 160 of the thermoelectric elements. For the situation in FIG. 3A, $V_{out}$ can be measured as a reference voltage that may have a none-zero value. When the hot surface 104 has a non uniform temperature distribution, e.g., the temperature at the first region 105 and the second region 106 being different, the voltage output can change from $V_{out}$ ($=V_2-V_1$) in FIG. 3A to $V_{out}'$ ($=V_2'-V_1'$) in FIG. 3B. The measured change of voltage output ($V_{out}'-V_{out}$) may reflect a local change of temperature/thermal dissipation on a sensing surface (e.g., the hot surface 104).

In the present disclosure, a single voltage output can be measured to indicate the surface local change of temperature/thermal dissipation. In some embodiments, electric current may be measured. Since the thermoelectric elements are connected in series, the measured electric current may be determined by its minimal value, and it may not be accurate to measure non-uniform heat dissipation rate or areal temperature gradient.

FIG. 4A is a top view of a thermoelectric sensor 200, according to one embodiment. The thermoelectric sensor 200 includes the differential thermoelectric device 100 that having the first region 105 and the second region 106 adjacent to each other. A sensing circuitry 220 is electrically connected to the thermoelectric sensor 100 to measure a voltage output thereof according to the temperature difference between the first and second regions 105 and 106. In the depicted embodiment, the sensing circuitry 220 is electrically connected to the distal ends (e.g., 154 and 164 in FIG. 3A or 3B) of the differential thermoelectric device 100 to measure the voltage output (e.g., $V_{out}$ in FIG. 3A or $V_{out}'$ in FIG. 3B). The differential thermoelectric device 100 and the sensing circuitry 220 can be supported by the same flexible substrate 210.

The embodiment of FIG. 4A can be a wireless thermoelectric sensor including a wireless component 222 connected to the sensing circuitry 220. The differential thermoelectric device 100, the sensing circuitry 220, and the wireless component 222 can be disposed on the same flexible substrate(s) 210 and powered by the same power source (e.g., a coin cell). The wireless component 222 may include, for example, a Bluetooth Low Energy (BLE) component. The wireless component 222 can wirelessly connected to a mobile device (e.g., a smartphone) for data transmission therebetween between. The signal from the sensing circuitry 220 can be sent, via the wireless component 222, to the mobile device which can process the signal to obtain desired information.

FIG. 4B is a top view of a thermoelectric sensor 200', according to another embodiment. The thermoelectric sensor 200' includes a differential thermoelectric device 100' that having the first region 105 and the second region 106 disposed at opposite ends of an elongated substrate 210. Electrical traces (not shown) can be provided to electrically connected, via a through electrode (e.g., the through electrode 140 of FIG. 1A), the thermoelectric elements in the first and second regions 105 and 106.

The substrate 210 can be bendable to adjust the relative position/orientation between the first and second regions 105 and 106 of the differential thermoelectric device 100'. In some embodiments, the substrate 210 can be adjusted such that the first and second regions 105 and 106 can face with respect to each other. The substrate 210 may be a flexible substrate made of any suitable materials such as, for example, polyethylene, polypropylene, cellulose, etc.

The sensing circuitry 220 is electrically connected to the differential thermoelectric device 100' to measure a voltage output thereof according to the temperature difference between the first and second regions 105 and 106. The sensing circuitry 220 and the optional wireless component 222 can be disposed at any suitable locations of the substrate 210. In the depicted embodiment, the sensing circuitry 220 and the wireless component 222 are disposed adjacent to the second region 106. In some embodiments, the sensing circuitry 220 and the wireless component 222 can be disposed on a portion of the substrate 210 between the first and second regions 105 and 106.

FIG. 5 is a top view of the thermoelectric sensor 200/200' of FIG. 4A or 4B used for detecting air flow adjacent to the first and second regions 105 and 106 of the thermoelectric sensor, according to one embodiment. In the depicted embodiment, the thermoelectric device 200/200' is supported by the substrate 210. The substrate 210 has its rear surface encapsulated by a pad 12. The pad 12 can include an adhesive layer to attach the thermoelectric device 200/200' to an object surface. The thermoelectric device 200/200' can have its front surface 202 exposed to air flow for heat exchange. For example, the first region 105 can be exposed to a local air flow 5, and the second region 106 can expose to a local air flow 6.

In some embodiments, the electrical conductors (e.g., 122 of FIG. 1A) of the thermoelectric elements in the first region 105 can be exposed to the air flow 5, in thermal contact and heat exchange with the air flow 5. The electrical conductors (e.g., 132 of FIG. 1A) of the thermoelectric elements in the second region 106 can be exposed to the air flow 6, in thermal contact and heat exchange with the air flow 6. In some embodiments, an optional, thermal-conductive adhesive layer can be provided on the sensor surface to enhance the heat exchange. It is to be understood that any suitable techniques can be used to enhance the heat exchange between the air flow and the sensor surface(s).

Different strength of air blow on the first and second regions 105 and 106 can create a thermal energy dissipation difference, which can induce different thermal gradient between opposite ends of the thermoelectric elements in the regions. When one of the air flows 5 and 6 changes its properties (e.g., velocity, density, moisture, etc.), the thermoelectric device 200/200' can detect the change by outputting a voltage (e.g., $V_{out}$) that reflects the induced temperature difference between the first and second regions 105 and 106 on the front surface 202, which in turn represents the property differences (e.g., velocity, density, etc.) between the air flows 5 and 6.

For example, assume that the sets of thermoelectric elements in the first and second regions 105 and 106 are substantially the same. When the voltage output $V_{out}$ has a value of about zero, it can be determined that the air flows 5 and 6 may be substantially the same. When the voltage output $V_{out}$ has a value of small positive, it can be determined that the air flow 5 may be slightly greater than the air flow 6. When the voltage output $V_{out}$ has a value of large positive, it can be determined that the air flow 5 may be significantly greater than the air flow 6. When the voltage output $V_{out}$ has a value of small negative, it can be determined that the air flow 5 may be slightly smaller than the air flow 6. When the voltage output $V_{out}$ has a value of large negative, it can be determined that the air flow 5 may be significantly smaller than the air flow 6.

It is to be understood that the measured surface temperature profile (e.g., the temperature different between the regions 105 and 106) may not be necessarily induced by an air flow. Other factors/means that may change the surface thermal energy dissipation rate can also be monitored. For example, in some embodiments, the differential thermoelectric devices can be applied to monitor connector malfunctions of steam pipe, or any other pipes holding thermal energy either hot or cold, as well as high-power electric lines. One side of the differential thermoelectric device can be attached to a connector, and the other side to a pipe or a line. In some embodiments, the differential thermoelectric devices can be applied to detect data center server overheating. For example, a differential thermoelectric device (e.g., in the form of a strip) can be attached to the server surface of interest to monitor where the overheating takes place.

Figure 6:
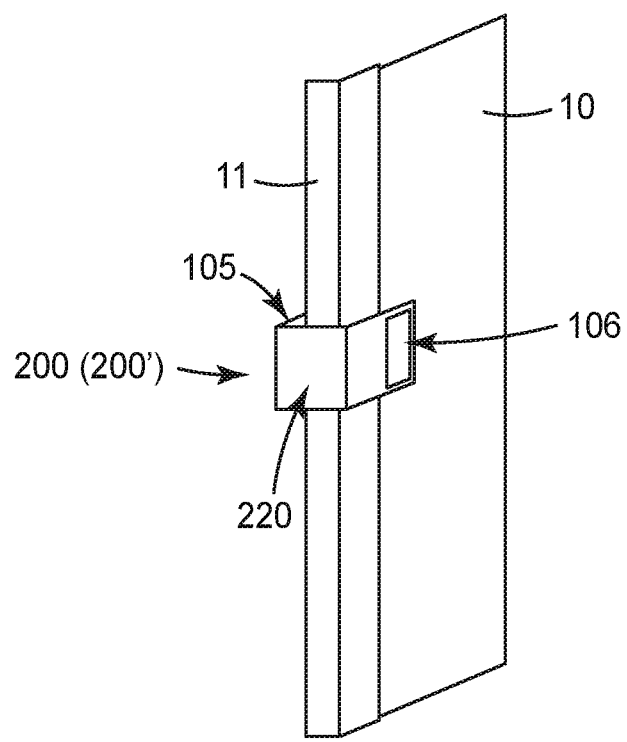
FIG. 6 illustrates a side perspective view of an air filtration apparatus including a thermoelectric sensor, according to one embodiment.

FIG. 6 illustrates a side perspective view of an air filtration apparatus including the thermoelectric sensor 200/200' of FIG. 4A or 4B, according to some embodiments. The air filtration apparatus includes an air filter 10 and the thermoelectric sensor 200/200' attached to the air filter 10 to obtain the status information of the air filter 10. The air filter 10 includes filter media 15 that separates an inlet surface or upstream face and an outlet surface or downstream face. The filter media 15 can filter an air flow therethrough from the inlet surface to the outlet surface. The filter media 15 may have its periphery surrounded by an optional perimeter frame 11. In some embodiments, the filter media may be replaceable by removing the filter media from the frame and replacing the filter media with new or reconditioned filter media. In some embodiments, the filter media 15 may be self-supported without a frame.

The thermoelectric sensor 200/200' is attached to the frame 11, bending to form a hanging structure such that the first and second regions 105 and 106 of the sensor are exposed to the upstream air flow and the downstream air flow, respectively. In the depicted embodiment, the sensing circuitry 220 is disposed between the first and second regions 105 and 106 to measure a voltage output between the first and second regions 105 and 106. The thermoelectric sensor 200/200' can be mounted to the frame 11, e.g., by adhesive. In some embodiments, the thermoelectric sensor 200/200' can be mounted to the frame 11 by a clapping mechanism.

When a new air filter is installed, a voltage output of the thermoelectric sensor 200/200' (e.g., the voltage output $V_{out}$ in FIG. 3A) can be measured by the sensing circuitry 220 as a reference voltage output $V_{t0}$. To monitor the status of the air filter over time, the voltage output $V_t$ can be measured during the use of the air filter. The difference ($V_t$-$V_{t0}$) of the voltage output can be compared with a preset threshold level. When the difference is beyond the threshold level, it is determined that the air filter needs to be replaced or repaired.

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments, but is to be controlled by the limitations set forth in the claims and any equivalents thereof.

Listing of Exemplary Embodiments

Exemplary embodiments are listed below. It is to be understood that any one of embodiments 1-11 and 12-20 can be combined.

Embodiment 1 is a thermoelectric sensor comprising:

a substrate having opposite first and second major surfaces;

a plurality of thermoelectric elements each supported by the substrate and extending between opposite first and second major surfaces of the substrate, the plurality of thermoelectric elements including first and second sets of thermoelectric elements, the first and second sets each including one or more thermoelectric elements electrically connected in series between a proximal end and a distal end thereof, the first set being disposed at a first region of the substrate, and the second set being disposed at a second region of the substrate;

a through electrode extending through the substrate and having a first end connecting to the proximal end of the first set of thermoelectric elements on the first major surface of the substrate and a second end connecting to the proximal end of the second set of thermoelectric elements on the second major surface of the substrate; and a sensing circuitry electrically connected to the distal ends of the first and second sets of thermoelectric elements to measure a voltage output.

Embodiment 2 is the thermoelectric sensor of embodiment 1, the first and second sets of thermoelectric elements each include one or more p-type thermoelectric elements and one or more n-type thermoelectric elements.

Embodiment 3 is the thermoelectric sensor of embodiment 2, wherein the through electrode connects a p-type thermoelectric element and an n-type thermoelectric element.

Embodiment 4 is the thermoelectric sensor of any one of embodiments 1-3, further comprising a first set of electrodes disposed at the first region of the substrate to electrically connect the first set of thermoelectric elements, and a second set of electrodes disposed at the second region of the substrate to electrically connect the second set of thermoelectric elements.

Embodiment 5 is the thermoelectric sensor of any one of embodiments 1-4, wherein the first and second sets of thermoelectric elements are substantially the same.

Embodiment 6 is the thermoelectric sensor of any one of embodiments 1-5, wherein the voltage output represents a temperature difference between the first and second regions on the first or second major surface.

Embodiment 7 is the thermoelectric sensor of any one of embodiments 1-6, wherein the sensing circuitry is supported by the substrate.

Embodiment 8 is the thermoelectric sensor of any one of embodiments 1-7, wherein the substrate includes a first flexible portion and a second flexible portion laminated with each other.

Embodiment 9 is the thermoelectric sensor of any one of embodiments 1-8, further comprising a heating or cooling element attached to one of the first or second major surface.

Embodiment 10 is the thermoelectric sensor of any one of embodiments 1-9, further comprising a thermal insulation layer attached to one of the first or second major surface.

Embodiment 11 is an air filtration apparatus comprising:

an air filter having an inlet surface and an outlet surface, the air filter configured to filter air flowing therethrough from the inlet surface to the outlet surface; and the thermoelectric sensor of any one of the preceding embodiments, the thermoelectric sensor being attached to the air filter and having the first and second regions at the first or second major surface exposed to the air flow, the measured voltage output representing a status of the air flow through the air filter.

Embodiment 12 is a method comprising:

providing a substrate having opposite first and second major surfaces;

providing a plurality of thermoelectric elements each supported by the substrate and extending between the opposite first and second major surfaces of the substrate, the plurality of thermoelectric elements including first and second sets of thermoelectric elements, the first and second sets each including one or more thermoelectric elements electrically connected in series between a proximal end and a distal end, the first set being disposed at a first region of the substrate, and the second set being disposed at a second region of the substrate;

providing a through electrode extending through the substrate and having a first end connecting to the proximal end of the first set of thermoelectric elements on the first major surface and a second end connecting to the proximal end of the second set of thermoelectric elements on the second major surface; and measuring, via a sensing circuitry, a voltage output between the distal ends of the first and second sets of thermoelectric elements.

Embodiment 13 is the method of embodiment 12, further comprising determining a temperature difference between the first and second regions on the first or second major surface based on the measured voltage output.

Embodiment 14 is the method of embodiment 12 or 13, wherein measuring a voltage output comprises measuring a first voltage output at a first time, and measuring a second voltage output at a second time.

Embodiment 15 is the method of embodiment 14, further comprising determining a temperature change upon time based on the measured first and second voltage outputs.

Embodiment 16 is the method of any one of embodiments 12-15, further comprising attaching a heating or cooling element to the second major surface.

Embodiment 17 is the method of any one of embodiments 12-16, further comprising thermally insulating the second major surface.

Embodiment 18 is the method of any one of embodiments 12-17, further comprising attaching the substrate to an air filter, wherein the first and second regions on one of the first and second major surfaces are exposed to an air flow adjacent the air filter.

Embodiment 19 is the method of embodiment 18, wherein the first region of the substrate is disposed at an upstream position of the air filter, and the second region of the substrate is disposed at a downstream position of the air filter.

Embodiment 20 is the method of embodiment 18 or 19, further comprising determining a status of the air flow through the air filter based on the measured voltage output.

Reference throughout this specification to "one embodiment," "certain embodiments," "one or more embodiments," or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment," or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about." Furthermore, various exemplary embodiments have been described. These and other embodiments are within the scope of the following claims.

What is claimed is:

1. A thermoelectric sensor comprising:
    a substrate having opposite first and second major surfaces;
    a plurality of thermoelectric elements each supported by the substrate and extending between the opposite first and second major surfaces of the substrate, the plurality of thermoelectric elements including first and second sets of thermoelectric elements, the first and second sets each including at least two thermoelectric elements electrically connected in series between a proximal end and a distal end thereof, the first set being disposed at a first region of the substrate, and the second set being disposed at a second region of the substrate, wherein the first and second sets of thermoelectric elements each include one or more p-type thermoelectric elements and one or more n-type thermoelectric elements;
    a through electrode extending through the substrate and having a first end connecting to the proximal end of the first set of thermoelectric elements on the first major surface of the substrate and a second end connecting to the proximal end of the second set of thermoelectric elements on the second major surface of the substrate, wherein the through electrode connects one of the p-type thermoelectric elements and one of the n-type thermoelectric elements; and
    a sensing circuitry electrically connected to the distal ends of the first and second sets of thermoelectric elements to measure a voltage output.

2. The thermoelectric sensor of claim 1, further comprising a first set of electrodes disposed at the first region of the substrate to electrically connect the first set of thermoelectric elements, and a second set of electrodes disposed at the second region of the substrate to electrically connect the second set of thermoelectric elements.

3. The thermoelectric sensor of claim 1, wherein the first and second sets of thermoelectric have a same number of identical thermoelectric elements.

4. The thermoelectric sensor of claim 1, wherein the voltage output represents a temperature difference between the first and second regions on the first or second major surface.

5. The thermoelectric sensor of claim 1, wherein the sensing circuitry is supported by the substrate.

6. The thermoelectric sensor of claim 1, wherein the substrate includes a first flexible portion and a second flexible portion laminated with each other.

7. The thermoelectric sensor of claim 1, further comprising a heating or cooling element attached to one of the first or second major surface.

8. The thermoelectric sensor of claim 1, further comprising a thermal insulation layer attached to one of the first or second major surface.

9. An air filtration apparatus comprising:
    an air filter having an inlet surface and an outlet surface, the air filter configured to filter air flowing therethrough from the inlet surface to the outlet surface; and
    the thermoelectric sensor of claim 1, the thermoelectric sensor being attached to the air filter and having the first and second regions at the first or second major surface exposed to the air flow, the measured voltage output representing a status of the air flow through the air filter.

10. A method comprising:
    providing a substrate having opposite first and second major surfaces;
    providing a plurality of thermoelectric elements each supported by the substrate and extending between the opposite first and second major surfaces of the substrate, the plurality of thermoelectric elements including first and second sets of thermoelectric elements, the first and second sets each including at least two thermoelectric elements electrically connected in series between a proximal end and a distal end, the first set being disposed at a first region of the substrate, and the second set being disposed at a second region of the substrate, wherein the first and second sets of thermoelectric elements each include one or more p-type thermoelectric elements and one or more n-type thermoelectric elements;

providing a through electrode extending through the substrate and having a first end connecting to the proximal end of the first set of thermoelectric elements on the first major surface and a second end connecting to the proximal end of the second set of thermoelectric elements on the second major surface, wherein the through electrode connects one of the p-type thermoelectric elements and one of the n-type thermoelectric elements; and measuring, via a sensing circuitry, a voltage output between the distal ends of the first and second sets of thermoelectric elements.

11. The method of claim 10, further comprising determining a temperature difference between the first and second regions on the first or second major surface based on the measured voltage output.

12. The method of claim 10, wherein the measuring of the voltage output comprises:

measuring, via the sensing circuitry, a first voltage output at a first time; and measuring, via the sensing circuitry, a second voltage output at a second time.

13. The method of claim 12, further comprising determining a temperature change over time based on the measured first and second voltage outputs.

14. The method of claim 10, further comprising attaching a heating or cooling element to the second major surface.

15. The method of claim 10, further comprising thermally insulating the second major surface.

16. The method of claim 10, further comprising attaching the substrate to an air filter, wherein the first and second regions on one of the first and second major surfaces are exposed to an air flow adjacent the air filter.

17. The method of claim 16, wherein the first region of the substrate is disposed at an upstream position of the air filter, and the second region of the substrate is disposed at a downstream position of the air filter.

18. The method of claim 16, further comprising determining a status of the air flow through the air filter based on the measured voltage output.

* * * * *

UNITED STATES PATENT AND TRADEMARK OFFICE
CERTIFICATE OF CORRECTION

PATENT NO. : 11,450,797 B2
APPLICATION NO. : 16/766394
DATED : September 20, 2022
INVENTOR(S) : Jae Yong Lee It is certified that error appears in the above-identified patent and that said Letters Patent is hereby corrected as shown below:

In the Claims

Column 12
Line 29, in Claim 3, insert --elements-- between "thermoelectric" and "have a".

Signed and Sealed this
Second Day of April, 2024

Katherine Kelly Vidal
Director of the United States Patent and Trademark Office